United States Patent [19]

Ullmann

[11] Patent Number: 5,731,984
[45] Date of Patent: Mar. 24, 1998

[54] VECTOR-BASED WAVEFORM ACQUISITION AND DISPLAY

[75] Inventor: Peter Frank Ullmann, San Jose, Calif.

[73] Assignee: Schlumberger Technologies Inc., San Jose, Calif.

[21] Appl. No.: 503,023

[22] Filed: Jul. 17, 1995

[51] Int. Cl.$^6$ .................................................. G01R 31/28
[52] U.S. Cl. .................. 364/487; 364/488; 371/21.1; 371/22.1; 371/24
[58] Field of Search ........................ 364/487, 486; 324/158.1; 371/24, 21.1, 21.2, 22.2, 22.31; 395/183.09–183.12; 365/200, 201

[56] References Cited

U.S. PATENT DOCUMENTS

| | | | |
|---|---|---|---|
| 4,139,903 | 2/1979 | Morrill, Jr. et al. | 395/140 |
| 4,251,815 | 2/1981 | Dagostino | 346/134 |
| 4,623,836 | 11/1986 | Frosien et al. | 324/72.5 |
| 4,683,420 | 7/1987 | Goutzoulis | 324/96 |
| 4,706,019 | 11/1987 | Richardson | 324/751 |
| 5,072,417 | 12/1991 | Aton et al. | 364/579 |
| 5,081,592 | 1/1992 | Jenq | 364/487 |
| 5,144,225 | 9/1992 | Talbot et al. | . |
| 5,235,270 | 8/1993 | Shimada et al. | 324/121 |
| 5,325,309 | 6/1994 | Halaviati et al. | 364/488 |
| 5,425,036 | 6/1995 | Liu et al. | 371/24 |
| 5,528,356 | 6/1996 | Harcout | 356/73.1 |

OTHER PUBLICATIONS

C. Talbot et al., *Logic Analyzer Software for a Multi-Sampling E-Beam Prober*, Microelectronic Engineering 12,(1990), pp. 65–72.

W. Lee, *Engineering a Device for Electron-Beam Probing*, IEEE Design & Test of Computers. Jun. 1989, pp. 36–49.

*Section 3: Basic Sampling Principles*, Tektronix 7S11 Sampling Unit Instruction Manual. Tektronix, Inc., Revised Oct. 1983, pp. 3-1 through 3-9.

*Feeling Comfortable with Digitizing Oscilloscopes*, Hewlett–Packard Company. Mar. 1987, Manual Part No. 9320-5776.

*Feeling Comfortable with Logic Analyzers*, Hewlett–Packard Company. Apr. 1988. Book Part No. 5954-2686.

*Primary Examiner*—Emanual T. Voeltz
*Assistant Examiner*—Demetra R. Smith
*Attorney, Agent, or Firm*—Bruce D. Riter

[57] ABSTRACT

Waveforms are acquired from a DUT into segments corresponding respectively to vectors of a vector pattern repetitively applied to the DUT. The waveform segments are displayed relative to vector numbers of the pattern to facilitate comparison of stimulus/response, debug, and other tasks. The relationship of the vector pattern is known relative to a trigger occurring once per repetition of the pattern, and vectors of the pattern are synchronous with a vector clock. The relationship of the time-domain waveform to the trigger is known. Taking account of these relationships and of system delays, each acquired waveform segment can be associated as it is acquired with a start-of-vector mark and with the corresponding vector number. Waveform displays are prepared which show the waveform segments corresponding to vector numbers of a user-selected range of vectors.

14 Claims, 15 Drawing Sheets

VECTOR-BASED WAVEFORM ACQUISITION AND DISPLAY

BACKGROUND OF THE INVENTION

1. Field of the Invention

The present invention relates to methods for acquiring and preparing displays of waveform information with reference to sequential vectors.

2. The Prior Art

Debugging of very large scale integrated circuits (VLSI) is an important element of design. Probing internal nodes of integrated circuits is a significant part of this process. Systems are known for acquiring waveforms on conductors of a device under test (DUT) by contact or non-contact probing with mechanical probes, e-beam probes, focused ion beam probes, etc. While these systems can readily acquire the waveform on a conductor, it is difficult and time-consuming to correlate a specific waveform segment with an expected event. Why? The waveform is acquired and displayed with measurement equipment operating in the time domain. The waveform is treated as an amplitude vs. time signal with reference to an arbitrary trigger. In contrast, the design, test and analysis of digital circuits are carded out in a domain based not on time but on vector sequences. A sequence of vectors applied to the DUT to produce the waveform, and the simulations used to produce the expected event information, are based on voltage or logic-level vs. vector number. Determining which segment of an acquired waveform corresponds to which applied vector and which expected event information has until now required tedious manual comparison of the events in the time-based waveform with vector sequences and simulation data.

A conventional analog oscilloscope triggers waveform acquisition either from an internally generated trigger pulse or from a single external pulse. This pulse can be any pulse in time. The oscilloscope does not have a reference regarding the origin of the pulse. The waveform is captured and displayed in real time, referenced to the trigger. A digital sampling oscilloscope operates in substantially the same way, except that each sample of the waveform is captured and displayed at a respective delay from the trigger.

A logic analyzer is triggered from a single external pulse, and may further be triggered whenever a particular measured event is detected. Internal sampling is governed by a free-running clock signal within the instrument so that a sample of the waveform is acquired with each pulse of the clock signal. External sampling relies on synchronization of the sample collected to an offset of a detected external clock signal. The external clock signal can be derived from the device that is having its waveform measured.

None of these systems offers the user a simple and intuitive display of waveforms relative to the vectors of a vector sequence applied to the device under test.

SUMMARY OF THE INVENTION

The invention offers methods for acquiring and preparing displays of waveforms acquired from a DUT in which the waveforms are divided into segments corresponding respectively to vectors of a vector pattern repetitively applied to the DUT. Waveform segments are displayed relative to vector numbers of the pattern to facilitate comparison of stimulus/response, debug, and other tasks. The relationship of the vector pattern is known relative to a trigger occurring once per repetition of the pattern, and vectors of the pattern are synchronized to a clock signal (e.g., a "vector clock"). The relationship of the time-domain waveform to the trigger is known. Taking account of these relationships and of system delays, each acquired waveform segment is associated with a start-of-vector mark and with the corresponding vector number as it is acquired. Waveform displays are prepared which show the waveform segments corresponding to vector numbers of a user-selected vector number range.

These and other features of the invention are disclosed in more detail below with reference to the accompanying drawing figures.

DETAILED DESCRIPTION

Waveforms acquired with any suitable probe system can be processed for display in accordance with the present invention, such as waveforms acquired with mechanical, electron-beam, ion-beam, laser-beam and other probe systems. To aid in understanding the invention, conventional waveform acquisition with a prior-art electron-beam system is first reviewed with reference to FIGS. 1 and 2.

Figure 1:
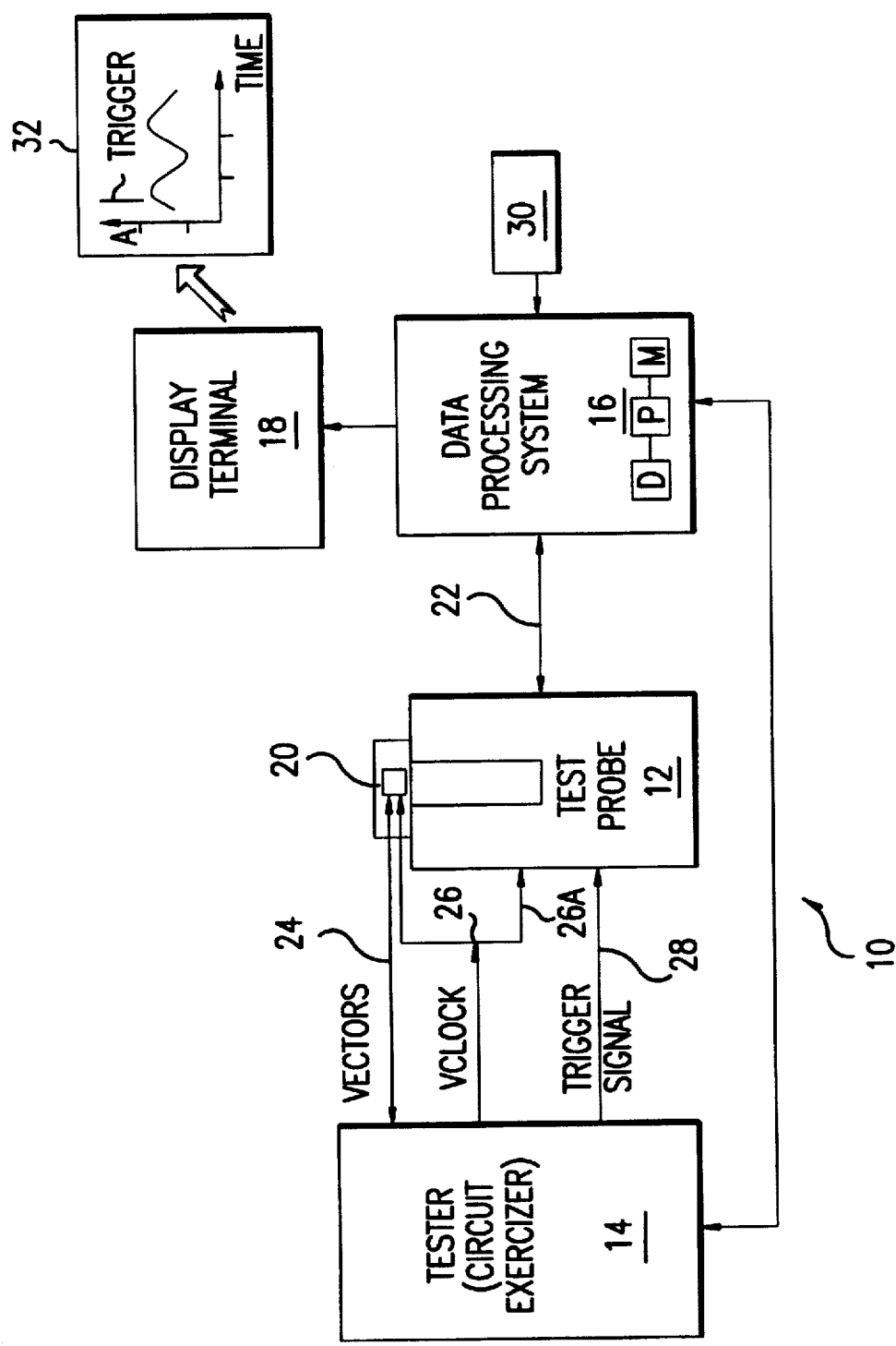
FIG. 1 shows a block diagram of an e-beam test probe system 10.

FIG. 1 shows a block diagram of an e-beam test probe system 10 having three functional elements: e-beam probe 12, circuit exerciser 14 and data processing system 16 with a processor P, memory M, data store D and display terminal 18. Circuit exerciser 14 may be a conventional integrated circuit tester, such as a model "TTS 9000FX" tester available from Schlumberger Technologies of San Jose, Calif., which can repeatedly apply a pattern of test vectors to a DUT 20 over a bus 24. A vector clock signal (Vclock) may also be supplied to DUT 20 over a line 26 as shown or over bus 24. The vector pattern is a sequence of vectors (e.g. event periods) which are synchronous with the Vclock signal and which are identified by sequential vector numbers. A vector can have a period equal to one or more Vclock periods. Though the number of Vclock pulses per vector is normally constant within a vector pattern, the period can vary from vector to vector if desired. Tester 14 provides a trigger signal to test probe 12 with each repetition of the pattern, e.g., via a bus 28 to indicate the start of the pattern.

E-beam probe 12 acquires potential measurements from DUT 20 under control of data processing system 16 via bus 22. Data processing system 16 may be used to load the tester with a program defining the pattern of test vectors and to control timing of the probe's potential measurements relative to the pattern. The user communicates with the data processing system via an input device 30 such as a keyboard or mouse. In conventional waveform acquisition, data processing system 16 displays in a window of terminal 18 an oscilloscope-like image 32 showing the acquired waveform in time domain (amplitude or logic level vs. time), beginning at a time following the trigger.

E-beam probes are typically equipped with high-speed beam-pulsing hardware such as a beam blanker. A pulsed e-beam directed at a conductor of interest allows measurement much like a sampling oscilloscope. The acquired waveform image may be qualitative (e.g., logic state maps for digital circuit debug) or, with a secondary-electron energy analyzer, quantitative (e.g. analog signal waveforms). For each point of the waveform image, a measurement is made by pulsing the electron beam at a specific time during application of the test vector pattern to the specimen circuit. As the time needed to make a potential measurement is generally longer than the time over which the test signal pattern remains constant, stroboscopic techniques are used. Each time the e-beam is pulsed, a measurement of potential on a conductor of the DUT is made. A single measurement has insufficient statistical accuracy to allow accurate determination of potential, so measurements made over many repetitions of the test vector pattern are averaged.

Figure 2:
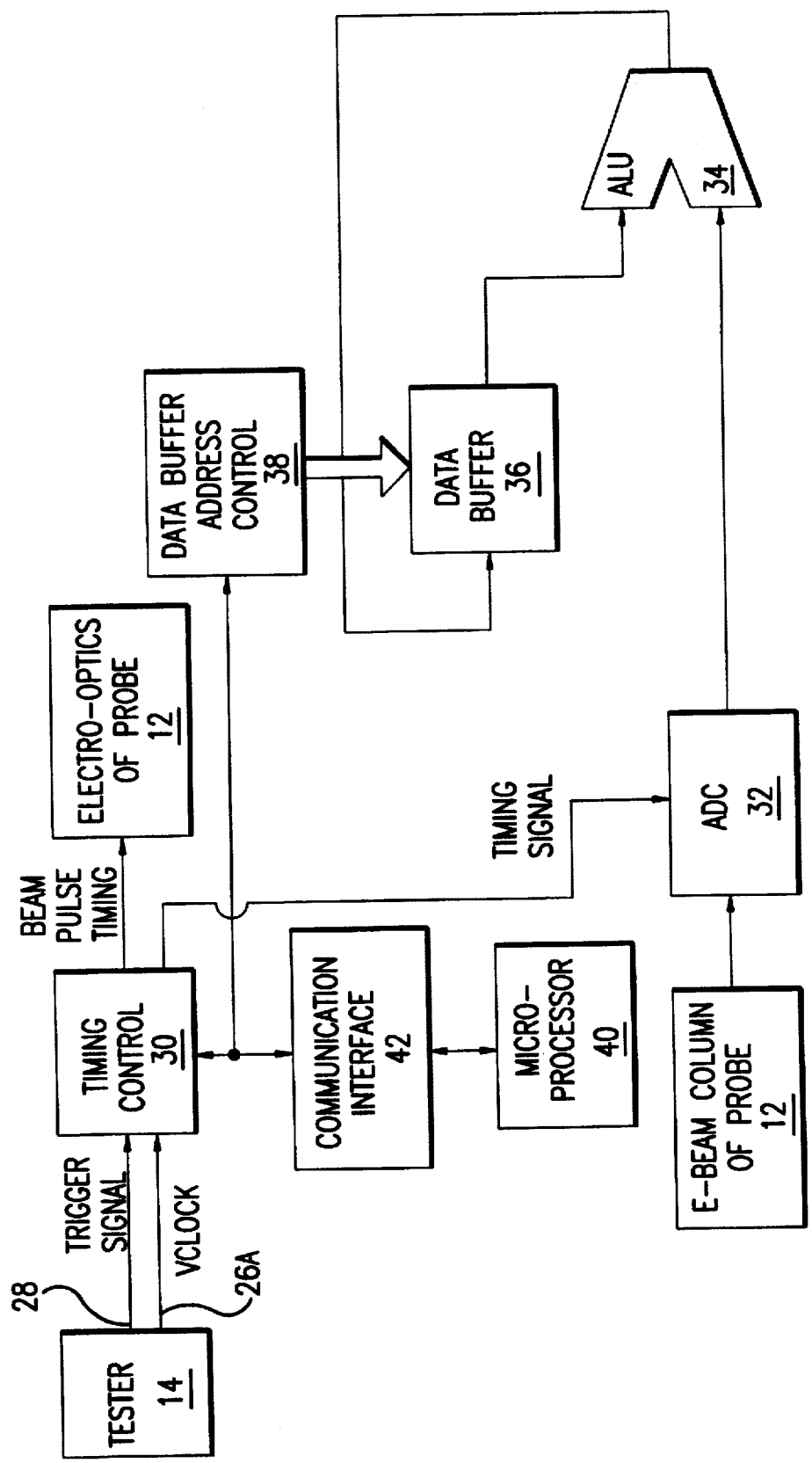
FIG. 2 shows a functional block diagram of portions of an e-beam probe system configured for acquisition of waveform images from a DUT.

FIG. 2 shows a functional block diagram of portions of an e-beam probe system configured for acquisition of waveform images from a DUT. A trigger signal from tester 14 is provided to a timing controller 30 of probe 12, which in turn supplies beam-pulse timing signals to the electro-optics of probe 12. Potential measurement signals from probe 12 are digitized by an analog-to-digital converter (ADC) 32 under control of a timing signal synchronized with the beam-pulse timing signals, and supplied to one input of an arithmetic logic unit (ALU) 34. A second input of ALU 34 receives data from data buffer 36. ALU 34 sums the data provided at its inputs and returns the sum to data buffer 36 under control of an address controller 38 which communicates with timing controller 30 and with a microprocessor 40 via a communication interface 42. Address controller 38 keeps track of which data stored in data buffer 36 relates to which point in the waveform so the data may be composed as a waveform image on display 18.

The system as described thus far is conventional. In conventional quantitative acquisition, probe 12 does not receive the Vclock signal and the beam-pulse timing is not synchronized to the Vclock signal or to the vector pattern. Beam pulses are controlled by a free-running clock which is independent of the tester's Vclock signal, and samples are acquired relative to a single trigger pulse per repetition of the vector pattern. The acquired waveform data is in time domain (amplitude vs. time); its timing relative to the trigger pulse is known but its timing relative to the Vclock signal is unknown. In conventional qualitative acquisition (e.g., in a "logic analyzer"), a clock signal supplied to the probe may be synchronous with the Vclock signal and thus with the vector pattern. However, no effort is made during waveform acquisition or display to track which waveform segment corresponds to which vector number of the pattern. Instead, the waveform is acquired and displayed in time domain (logic level vs. time). The user is left with the task of manually relating waveform events to vector numbers by inspection of the displayed waveform.

Figure 3:
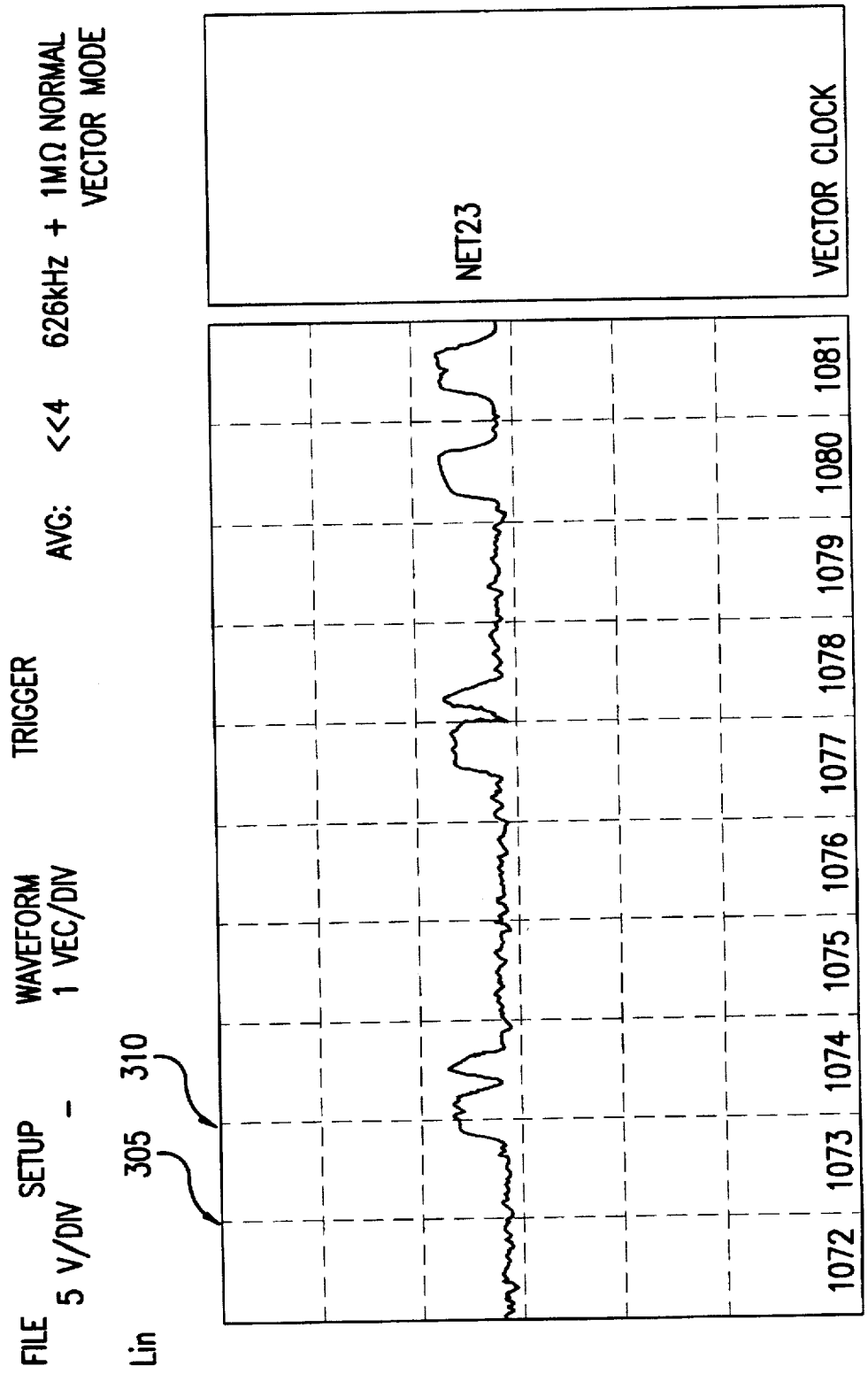
FIG. 3 shows an acquired-waveform segment displayed as amplitude vs. vector number in accordance with the invention.

In accordance with the present invention, a signal which is synchronous with the vectors (e.g., the Vclock signal) is used to relate waveform data with vector numbers so that waveform segments are acquired and displayed in "vector-domain" (amplitude or logic level vs. vector number). FIG. 3 shows such a display, which includes a segment of a waveform acquired from net 23 of a DUT as vectors 1072 through 1081 of a vector pattern were applied to the DUT. Those of skill in the art who have tried to determine which portion of a conventional time-domain waveform corresponds to which applied vector will appreciate the value of such a display—it allows the user to immediately identify the portion of a lengthy waveform which contains a transition of interest and thus dramatically reduces the time needed for debug.

In accordance with the invention, the Vclock signal is supplied to the test probe, e.g., to test probe 12 via line 26A to the probe's timing controller, for use in relating acquired waveform segments to specific vectors of the vector sequence as described below.

Figure 4:
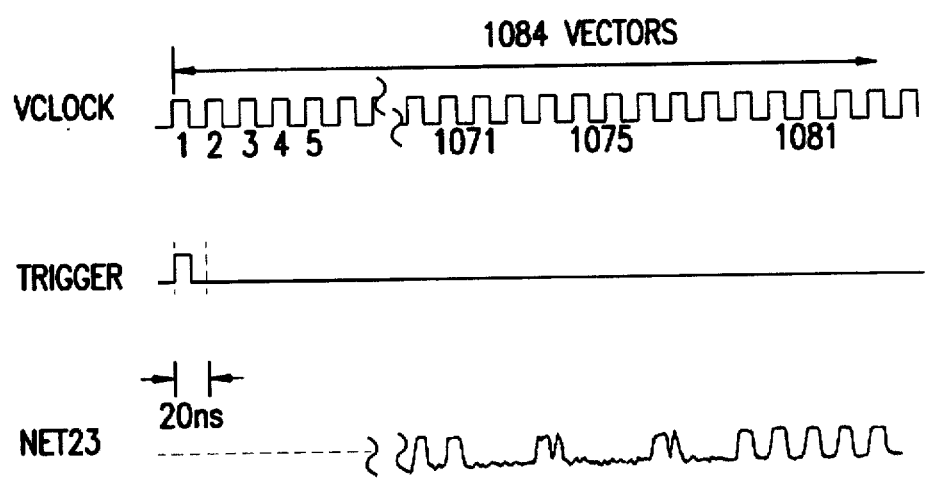
FIG. 4 shows the relationship for the example of FIG. 3 between the tester's Vclock, the once-per-pattern-repetition trigger signal, and the waveform acquired from a net of the DUT.

FIG. 4 shows the relationship for the example of FIG. 3 between a tester's Vclock signal, the once-per-pattern-repetition trigger signal, and the waveform acquired from net 23 of the DUT. In this example the Vclock period is 20 ns, the vector period is 20 ns, and the pattern has 1084 vectors. The test vector pattern is known, the timing relation of the trigger to the vector pattern is known at the tester, and the timing relation of the trigger to the acquired waveform is known at the probe. The task for preparing the image of FIG. 3 is to capture and display in sequence those portions of the waveform on net 23 which correspond respectively to the application of vectors 1072–1084 to the DUT.

Figure 5:
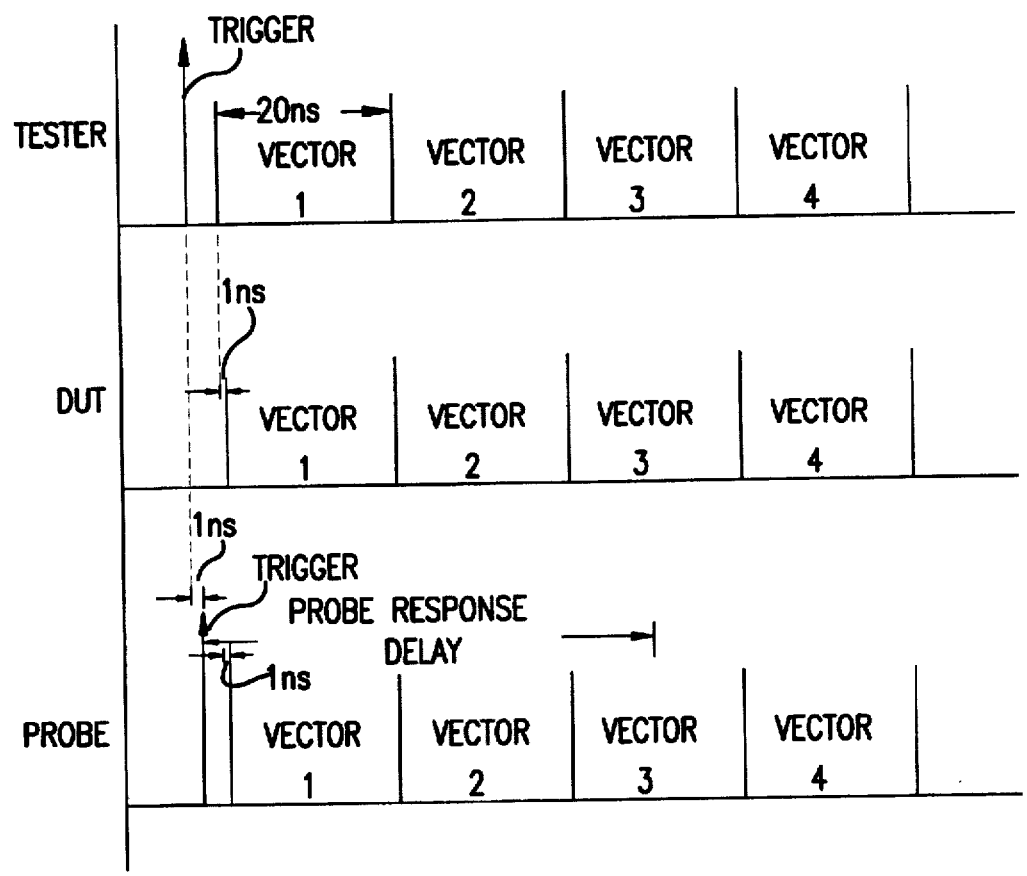
FIG. 5 illustrates system delay.

Because of inherent system delays, waveform data generally cannot be acquired for all vectors of a pattern applied to the DUT. FIG. 5 illustrates. The tester transmits a trigger pulse which is detected at the probe after some delay, e.g., 1 ns. At some interval after transmitting the trigger pulse, the tester transmits a sequence of vectors 1, 2, 3, 4, etc. In the example shown in FIG. 5, each vector has a period of 20 ns. The DUT responds to each vector after some delay, e.g., 1 ns. The probe may also have a response delay, making it unable to acquire waveform for some time after detecting the trigger pulse. In the case of an e-beam probe the delay can be, e.g., some 50 ns. In the example of FIG. 5, the probe response delay extends into the period of vector #3 so that the first full vector period during which the probe can acquire waveform data from the DUT is vector #4. In general, there is typically some "system delay" interval during which the probe is unable to acquire waveform data from the DUT. The system delay can be considered the sum of the trigger transmission delay (e.g., 1 ns) and the probe response delay (e.g., 50 ns) less the DUT response delay (e.g., 1 ns).

One way to determine the system delay is to acquire a waveform and then examine it for a known event. For example, if it is known that pin 23 of the DUT will transition from low to high at vector #10 in response to a master reset command, vector #10 is identified by locating the waveform edge where pin 23 goes high. The probe counts Vclock pulses during waveform acquisition, and thus knows the number of Vclock pulses from receipt of the trigger to the edge where pin 23 goes high. That point is taken as an event occurrence within vector #10. System delay can be determined by manual inspection of the acquired waveform or by the probe's processor under control of a suitable calibration program. Once determined for a given hardware configuration, the system delay remains constant. A preferred method of system calibration is described in more detail below.

Figure 6:
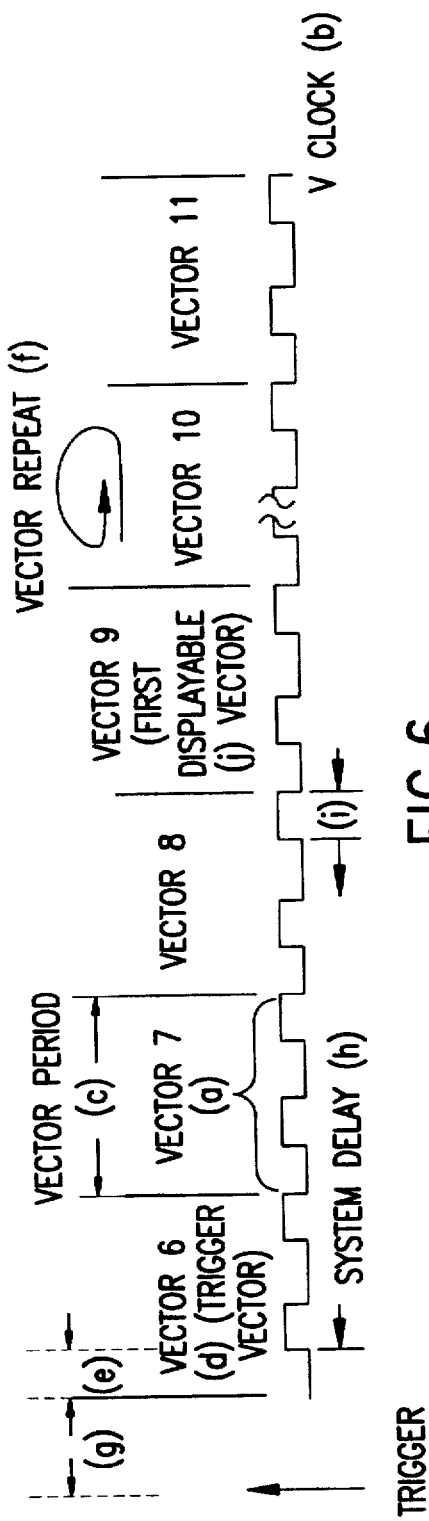
FIG. 6 shows an example of the relationship of the Vclock signal and trigger signal to the vectors.

FIG. 6 shows an example of the relationship of the Vclock signal and trigger signal to vector numbers. The number of Vclock pulses per vector is shown at (a). The free-running Vclock signal is shown at (b). The vector period is shown at (c). The trigger vector, the first full vector period after the trigger, is shown at (d). The interval from the start-of-vector to the next Vclock reference-edge is shown at (e). Repeat vectors are shown at (f). The interval from the trigger to the next start-of-vector is shown at (g). System delay is shown at (h). The interval from the end of system delay to the next start-of-vector is shown at (i). The first displayable vector, shown at (j), is the first full vector period for which waveform data can be acquired, owing to the system delay.

Variables (a)–(i), collectively termed the vector set construct, can be user-defined or automatically determined by suitable means before waveform acquisition. The vector set construct is used to determine the first displayable vector and to continuously determine in real time during waveform acquisition which vector number is being measured at the DUT as each portion of the waveform is acquired. That is, the vector sequence, vector clocks per vector, start/end of vectors, and repeating vectors are monitored so that waveform data is associated with a vector number as it is being acquired. Detection of the trigger by a count-start trigger detector causes a pulse counter to begin counting Vclock pulses. Vector periods are associated with the count of Vclock pulses and can be any defined number of Vclock pulses. In the example of FIG. 6, one vector period is equal to two Vclock pulse periods.

Figure 20A:
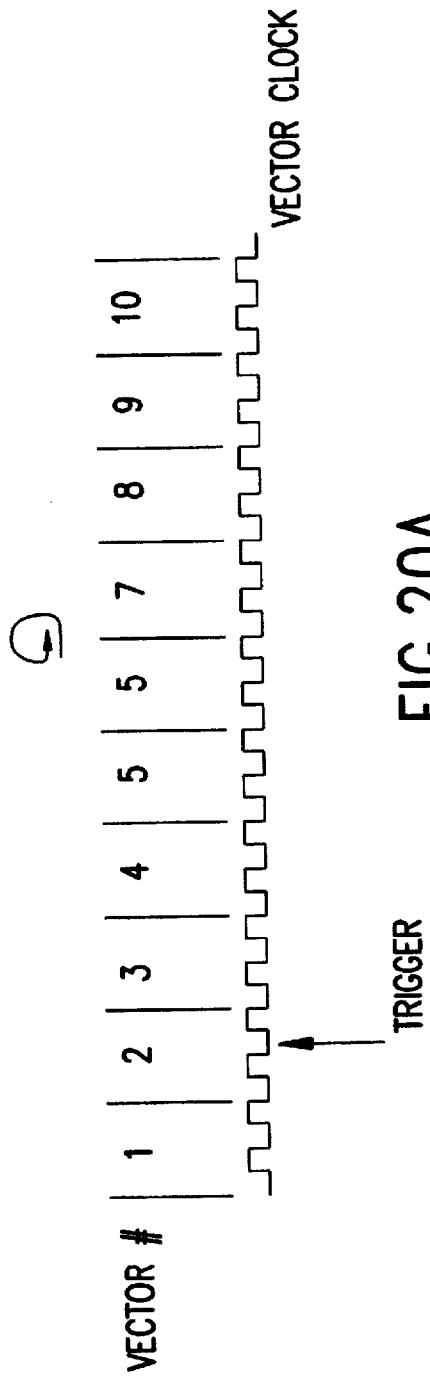
FIGS. 20A and 20B show an example of a test pattern having a vector loop.
Figure 20B:
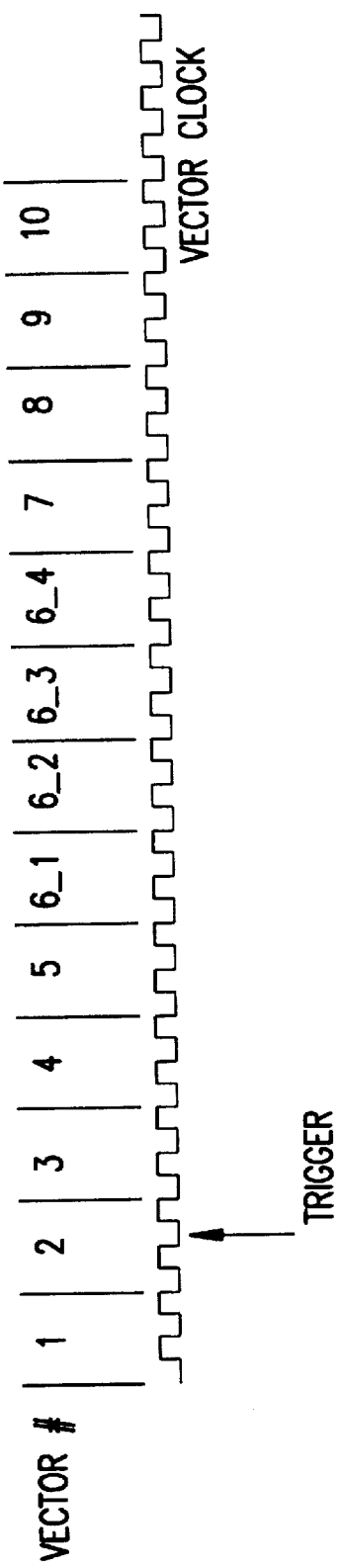

At any time during waveform acquisition, the current vector period is equal to the current vector number plus the quantity of vector loops during previous vectors. Vector loops are taken into account so that the vector number is known for each vector period. A vector loop is a plurality of vector periods having the same vector number (also called a "vector repeat"). For example, FIGS. 20A and 20B show a test pattern having vectors 1 through 10 in which each of vectors 1 through 5 and 7 through 10 has a duration of one vector period. Vector 6 has a duration of four vector periods labeled in the tester program as 6-1, 6-2, 6-3 and 6-4, respectively. The pattern has only 10 vectors, but has a duration of 13 vector periods. The trigger occurs during vector 2, so vector 3 is the trigger vector. In this example, vector periods are counted as follows:

| Vector # | Vector Period Count |
| --- | --- |
| 1 | 0 |
| 2 | 0 |
| 3 | 1 |
| 4 | 2 |
| 5 | 3 |
| 6-1 | 4 |
| 6-2 | 5 |
| 6-3 | 6 |
| 6-4 | 7 |
| 7 | 8 |
| 8 | 9 |
| 9 | 10 |
| 10 | 11 |

Vector #7 thus corresponds to waveform data acquired during the 8th vector period following the trigger, and that data is labeled as vector #7 for display purposes.

Referring to FIG. 6, the first displayable vector number can be determined as follows:

First displayable vector #=[nat{((SystemDelay h)+(interval e))/ (Vector Period c)+0.999}]+TriggerVector# where the notation "nat" indicates taking the value of the natural number. Otherwise stated, the first displayable vector number is taken to be the trigger vector number plus the number of vector periods affected by system delay. The number of vector periods affected by system delay can be represented as:

of System Delay Vectors (SDV)=nat {(SystemDelay h)/(VectorPeriod c)+0.999}

If the system delay ends during a vector, the next vector is taken as the first displayable vector:

If [(SDV * (VectorPeriod c))−(interval e)]<SystemDelay

Then

SDV=SDV+1

Assume in the example of FIG. 6 that the vector period is 20 ns, vector #6 is the trigger vector, interval e is 2 ns, and the system delay is 50 ns. The first displayable vector # is then calculated as:

FirstDisplayableVector# = [nat{(50 + 2)/20 + 0.999}] + 6
 = [nat{2.6 + 0.999}] + 6
 = 3 + 6
 = 9

In this example, SDV=nat {(50 ns/20 ns)+0.999}=3. In this example, SDV need not be incremented to 4 because [(SDV * (VectorPeriod c))−(interval e)]=3*20 ns−2 ns=58 ns, which is not less than the system delay of 50 ns.

To determine the number of Vclock pulses to count from the end of system delay to find any given "current" vector number:

VclockPulses=[(CurrentVector#−SDV−TriggerVector#) * (#ClocksPerVector)]+1

In the example, if waveform data is to be acquired for vector #11, then the count of Vclock pulses from the end of system delay (assuming that vector #10 is not repeated) is:

VclockPulses=[(11−3−6) * 2]+1=5

Of course, if any vectors are repeated, then the repeated vectors must be taken into account.

The time interval i from the end of system delay h to the start of the first displayable vector j is determined as:

Interval(i)=[(SDV * VectorPeriod)−(interval e)−(System Delay h)]

In the example, Interval(i)=3 *20 ns−2 ns−50 ns=8 ns.

When acquiring waveforms with an e-beam probe or other system operating as a sampling oscilloscope, each sample point can be considered a "pixel" and the delay time from the end of system delay to the first pixel of the current to-be-acquired vector set as:

PixelDelayTime=[SDV * (VectorPeriod c)]−(interval e)−(System Delay h)

The number of pixels to acquire per vector period before incrementing to the next vector number is a value set by the user before waveform acquisition.

Figure 7:
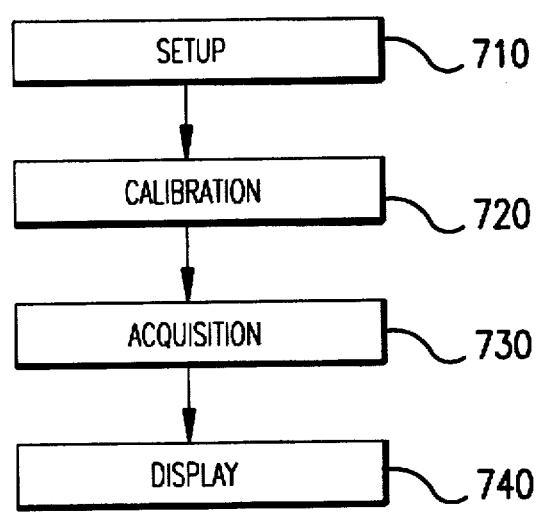
FIGS. 7–11 show an operating method in accordance with the invention.

An operating method in accordance with the invention is shown in FIGS. 7–11. As shown in FIG. 7, the method comprises four main steps: setup 710, calibration 720, waveform acquisition 730, and waveform display 740. Each of these steps comprises a series of steps.

Figure 8:
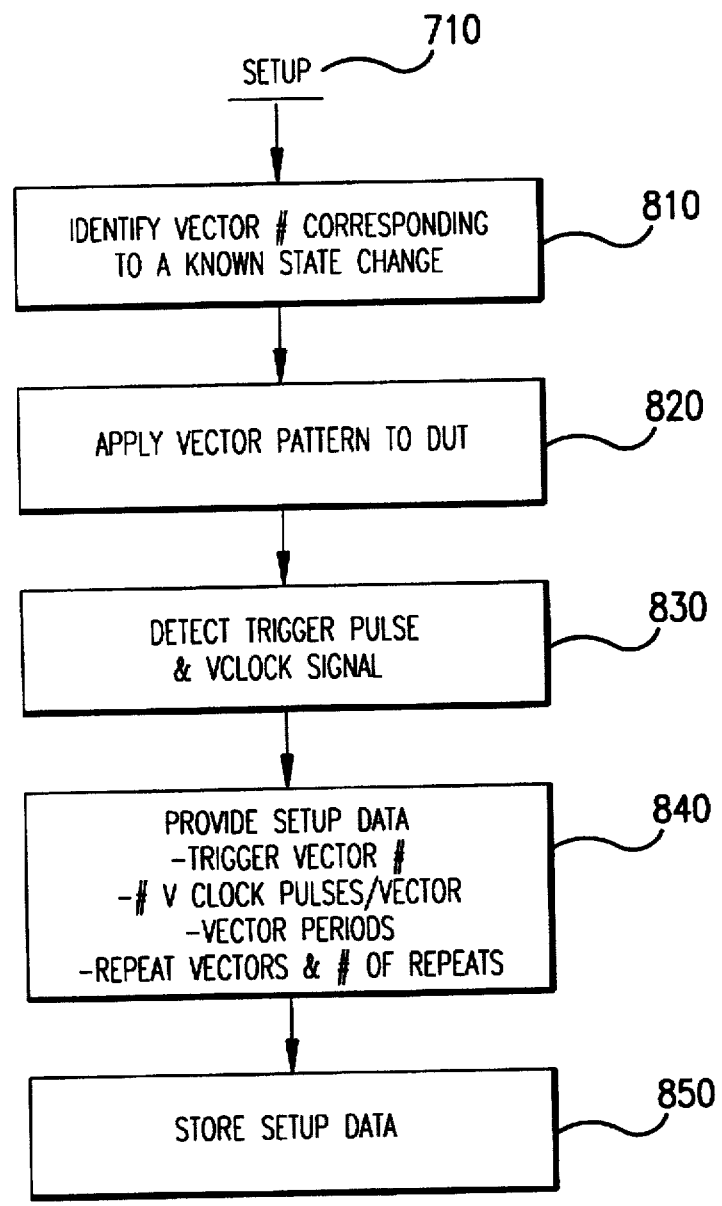

FIG. 8 shows setup steps. In step 810, the vector # corresponding to a known state change is identified, e.g., by input from the user. In step 820, the tester begins applying the vector pattern to the DUT. In step 830, the trigger pulse and Vclock signal are provided to and detected at the probe. In step 840, additional setup data are provided, e.g., by user input: trigger vector number, the number of Vclock pulses per vector, the duration of vector periods, and the vector numbers of repeat vectors as well as the number of times each is repeated. In step 850, the setup data is stored for use in following steps.

Figure 9:
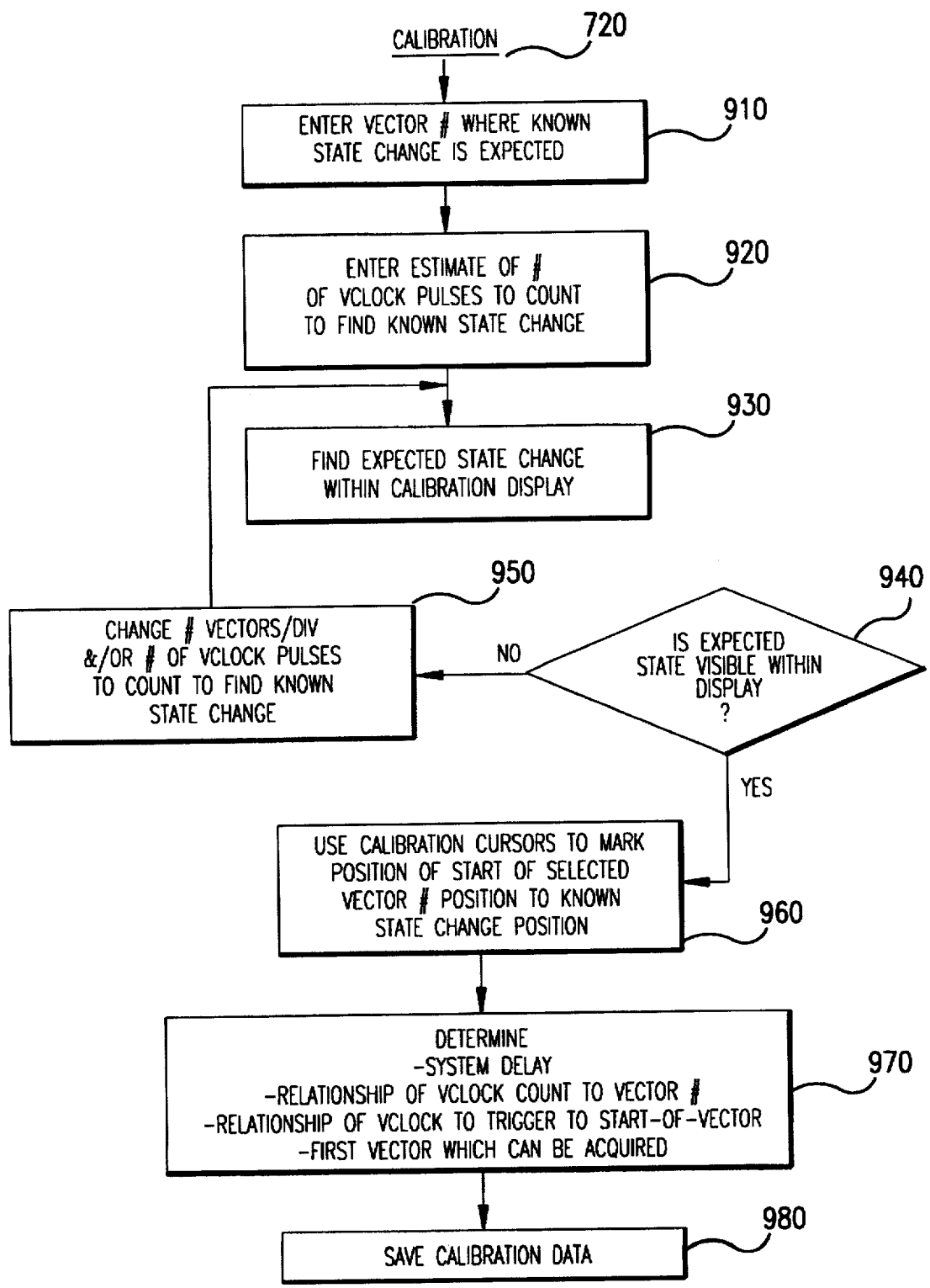

FIG. 9 shows calibration steps. In step 910, the number of a vector where a known state change is expected is entered, e.g., by user input. In step 920, an estimate of the number of Vclock pulses to count following the trigger to reach the known state change is entered, e.g., by user input. In step 930, a waveform segment corresponding to the number of Vclock pulses entered in step 920 is acquired and displayed, and the user inspects the displayed waveform segment to locate the expected state change. Step 940 tests whether the expected state change is found within the display. If not, then in step 950 the number of vectors displayed per division is changed or the number of Vclock pulses to count is changed in order to display additional waveform portions. When the expected state change is found within the display, step 960 involves using calibration cursors to mark on the displayed waveform segment the start of a selected vector period relative to the known state change. The calibration cursors are set, e.g., by user input. In step 970, parameters are determined from the positions of the calibration cursors: system delay, relationship of Vclock count to vector number, relationship of Vclock pulses to trigger pulse to start-of-vector, and vector number of first vector which can be acquired. In step 980, the calibration data are saved for subsequent use.

Figure 12:
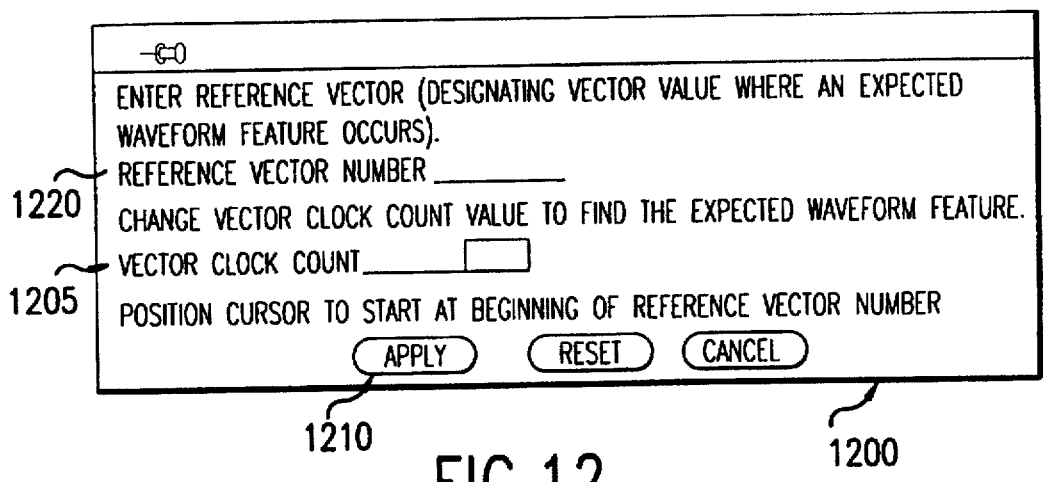
FIG. 12 shows a calibration setup panel display in accordance with the invention.
Figure 13:
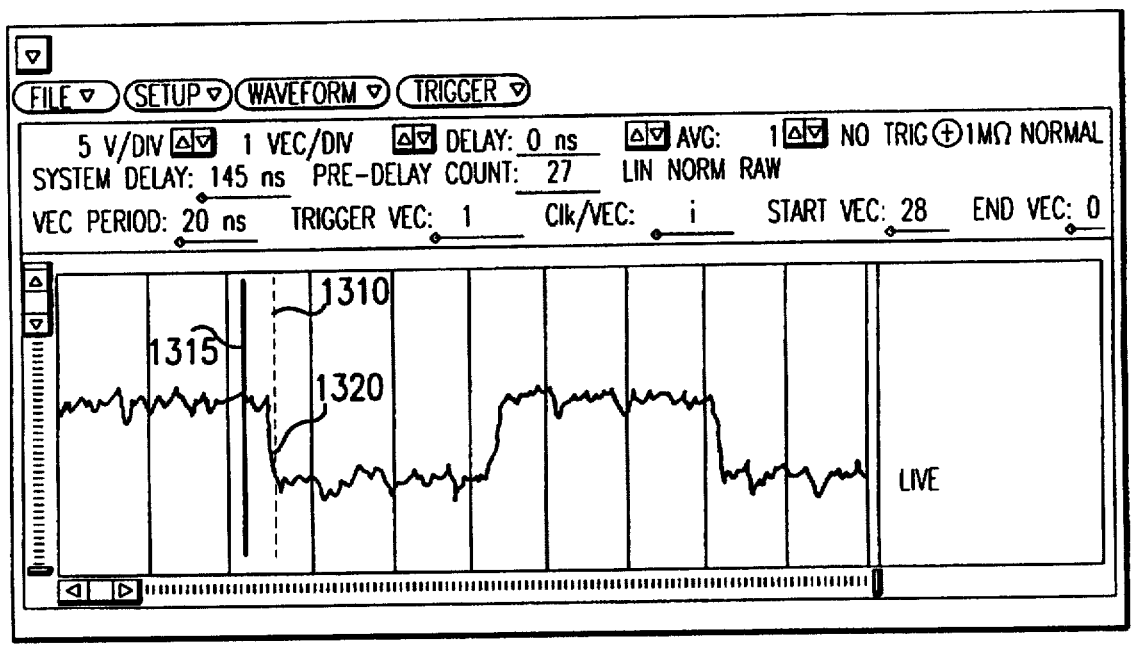
FIG. 13 shows a calibration display in accordance with the invention.

FIGS. 12–13 show screen displays of a software tool which can be used in calibration. FIG. 12 shows a setup panel display 1200. FIG. 13 shows a calibration display 1300.

Prompted by the instructions of FIG. 12, the user enters the reference vector number at 1220 and estimated Vclock count at 1205. Line cursors 1310 and 1315 appear on the calibration display, along with a waveform segment. Dashed cursor 1310 is a waveform-event position reference. Solid cursor 1315 is a start-of-vector position reference. The user enters at 1220 the vector number of an expected reference event 1320, such as a known write-enable line transition or a master-reset line transition. A table of data from the tester or simulator has already been entered during setup defining the vector periods and vector loops. The user finds the expected waveform feature 1320 corresponding to the expected reference vector by incrementing/decrementing the vector clock count at 1205 until the waveform feature (e.g., a reference edge 1320 of interest) is captured by the probe and displayed in the calibration display. The number of vectors per division can initially be set to a high number to locate the waveform feature and then changed to a lower value for a higher resolution display while keeping the waveform feature within the display.

The user positions dashed cursor 1310 to coincide with the waveform feature 1320 as shown in FIG. 13, and moves the solid cursor 1315 to a position representing the start-of-vector for the vector in which the waveform feature occurs. The offset between the displayed cursors indicates the time offset between the start-of-vector and the known feature of interest. The time scale is based for example on the average vector period definition from the tester or simulator pattern-definition files. If the user enters a vector-count value which correlates to being less than the system delay, the lowest permissible value vector-count value will automatically enter, and a message will be displayed to indicate that the vector-count value entered is lower than can be captured. The user clicks on the "apply" button 1210 of setup display 1200 to signify that the system is to accept the relationship indicated shown in FIG. 13 between the vector clock count, the offset of the reference edge and the reference vector number. A message is then displayed to indicate that the system is calibrated, cursor bars 1310 and 1315 are removed from the display, and the setup panel display 1200 disappears from view.

Figure 10:
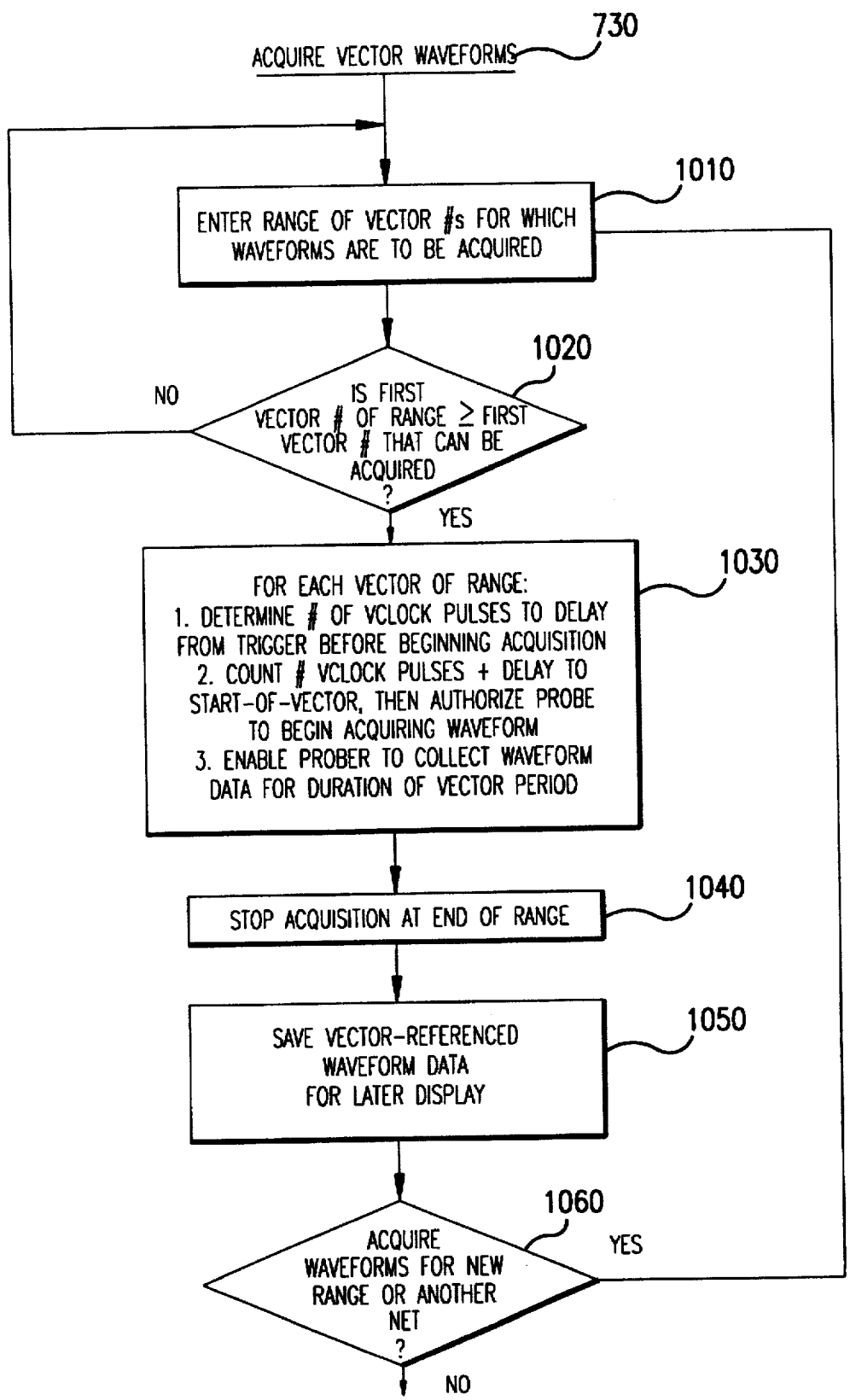

FIG. 10 shows waveform-acquisition step s. In step 1010, the range of vector numbers is entered for which waveforms are to be acquired, e.g., by user input. In step 1020, the entered range is tested to assure the first vector number of the range is greater than or equal to the vector number of the first vector for which data can be acquired. If no, control returns to step 1010. If yes, in step 1030 a series of steps is performed for each vector of the range of vector numbers entered in step 1010. First, the number of Vclock pulses to delay from the trigger pulse before beginning acquisition is determined. Second, following the trigger the determined number of Vclock pulses is counted and delay is added to arrive at the next start-of-vector, and the probe is commanded to begin acquiring waveform data. Third, the prober is enabled to continue collecting waveform data for the duration of the vector period. When waveform data has been acquired for each vector of the selected range of vector numbers, acquisition stops at step 1040. In step 1050, the vector-referenced waveform data is saved for later display. If waveforms are to be acquired for another range of vector numbers and/or for another net of the DUT, control returns to step 1010. If not, waveform acquisition ends.

Figure 14:
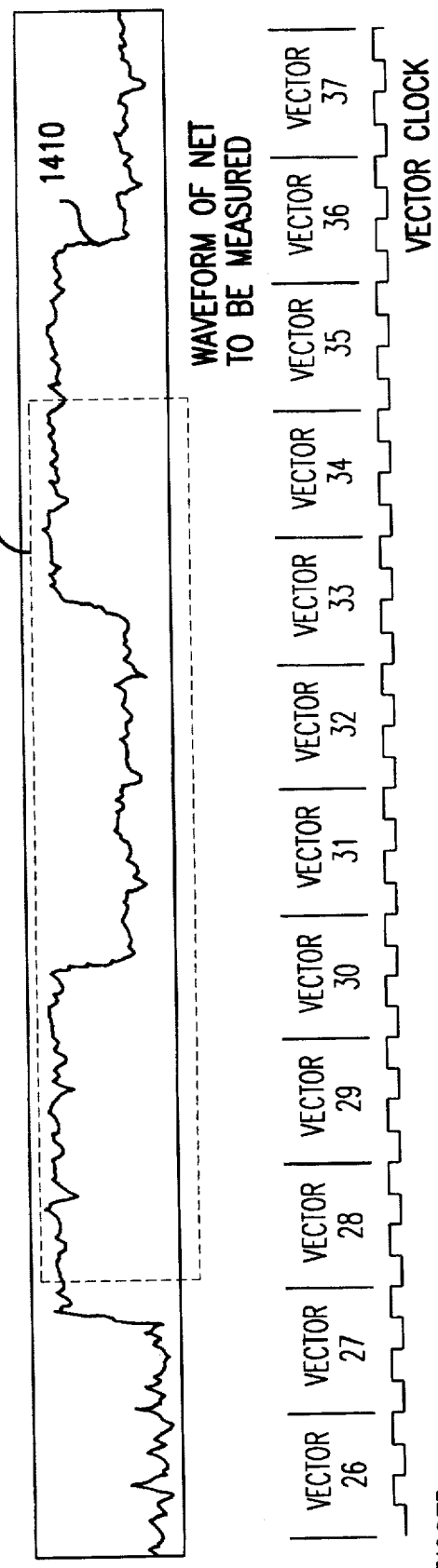
FIG. 14 shows an example of the acquisition of waveform data in accordance with the invention.

FIG. 14 shows an example of the acquisition of waveform data. At some time following the trigger is a sequence of vector periods corresponding to vectors 26–37, related as indicated to the vector clock and all being well after the first vector period for which waveform data can be acquired. The range for which waveform data is to be acquired is from vector 28 through vector 34. Shown at 1410 is the waveform appearing on net 28 of a DUT. The dashed box 1420 shows the range over which waveform data is to be acquired.

Figure 11:
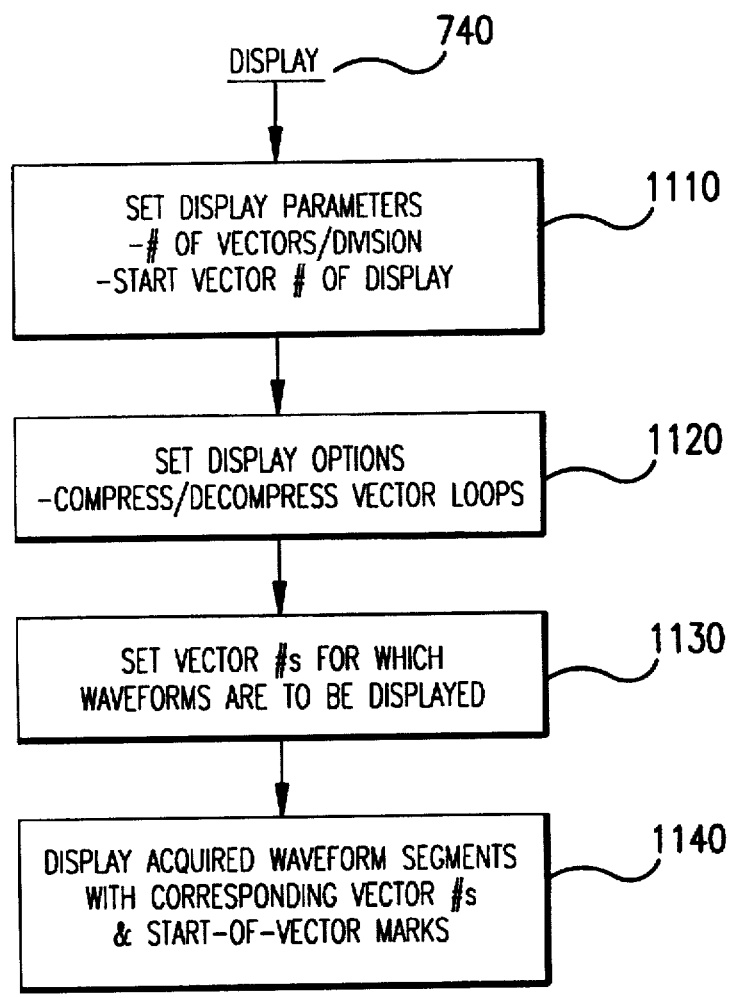

FIG. 11 shows display steps. In step 1110, display parameters are set, such as number of vectors per division and starting vector number of the display. In step 1120, display options are set, such as compression/decompression of vector loops. In step 1130, the vector numbers are set for which waveform segments are to be displayed. In step 1140, the acquired waveform segments (or previously-acquired and stored waveform segments) are displayed, along with corresponding vector numbers and start-of-vector marks.

Figure 15:
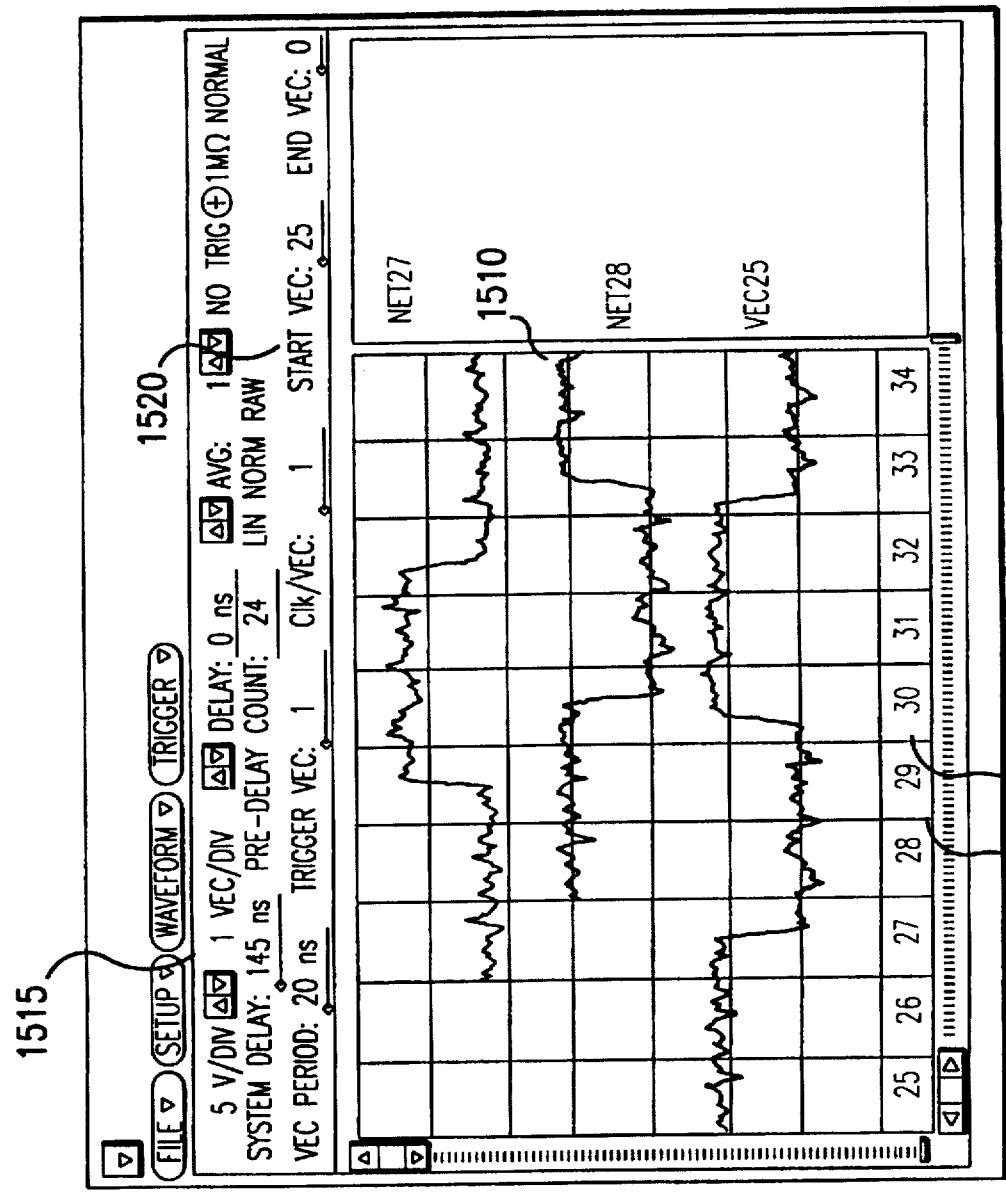
FIG. 15 shows an example of a waveform display in which waveforms acquired from multiple nets are displayed in accordance with the invention.

FIG. 15 shows an example of a waveform display in which waveforms acquired from multiple nets are displayed in accordance with the invention. In this example, the center waveform displayed at 1510 is that on net 28 of the DUT over the range of vector numbers 28–34 (as shown in box 1420 of FIG. 14). Markings in the display represent start-of-vector, and a sequential vector number is associated with each start-of-vector mark. In FIG. 15, start-of-vector mark 1505 indicates the start of a vector period, and sequential vector number 28 is associated with mark 1505. Start-of-vector marks are separated by the period of a vector and are synchronous with Vclock pulses, but may lead or trail a reference edge of the Vclock pulses by a fixed interval as shown in FIG. 6. In FIG. 15, start-of-vector mark 1505 is separated from start-of-vector mark 1510 by one vector period. The number of vectors per division is shown at 1515 (in this example, one) and the starting vector number of the display is shown at 1520 (in this example, 25); these values were set in step 1110.

When an event happens within a given vector period, e.g., a signal going from high to low on net 28 during vector #30 in FIG. 15, the event is displayed in time relationship to the start-of-vector mark. That is, a waveform segment is displayed as signal amplitude information vs. time for each vector interval beginning at the calculated start-of-vector mark for that vector. The waveform segments can be considered as "tiles" to be arranged in the display as directed by the user. Waveform segments to be compared can be displayed adjacent one another (e.g., side-by-side or over-and-under) as the waveforms on nets 27, 28 and vec25 of FIG. 15. Portions of the waveform not of interest to the user (e.g., the waveform on net 28 from vectors 25–27 in FIG. 15) can be skipped over without being displayed.

Figure 16:
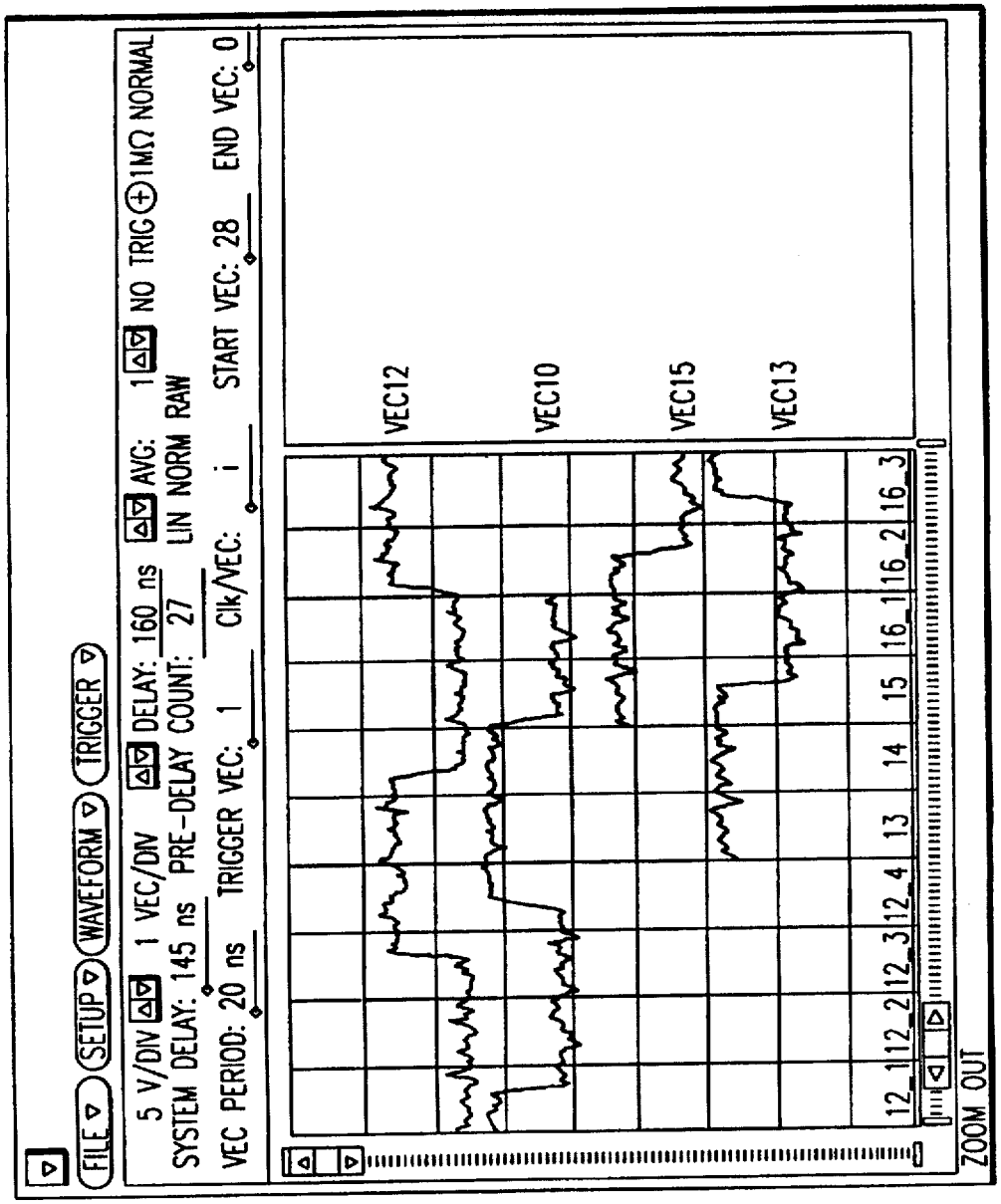
FIG. 16 shows an example of multiple waveforms displayed in accordance with the invention with repeat vectors visible.

Repeat vectors may be displayed or not displayed as the user requests. FIG. 16 shows an example of multiple waveforms displayed with repeat vectors visible (decompressed). The vector numbers of the displayed segments are, in sequence, 12__1, 12__2, 12__3, 12__4, 13, 14, 15, 16__1, 16__2, 16__3. To keep the counting method simple during acquisition, the waveform segments can be acquired by counting vector periods from the trigger vector; the vector numbers and repeat-vector numbers can assigned during preparation of the display. Repeat vectors are in some cases of little interest to the user, e.g., when a vector is repeated many times to initialize the DUT. The user may wish to see only one of many repetitions of the waveform event resulting from the initialization vector, followed by a the waveform events of a vector which begins to exercise the DUT.

Figure 17:
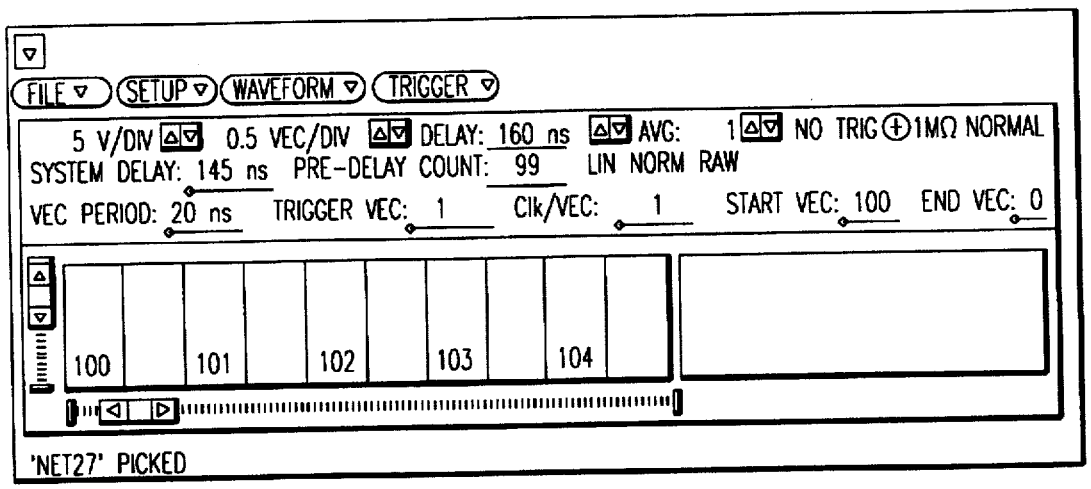
FIG. 17 shows an example of a display in accordance with the invention having two divisions per vector.
Figure 18:
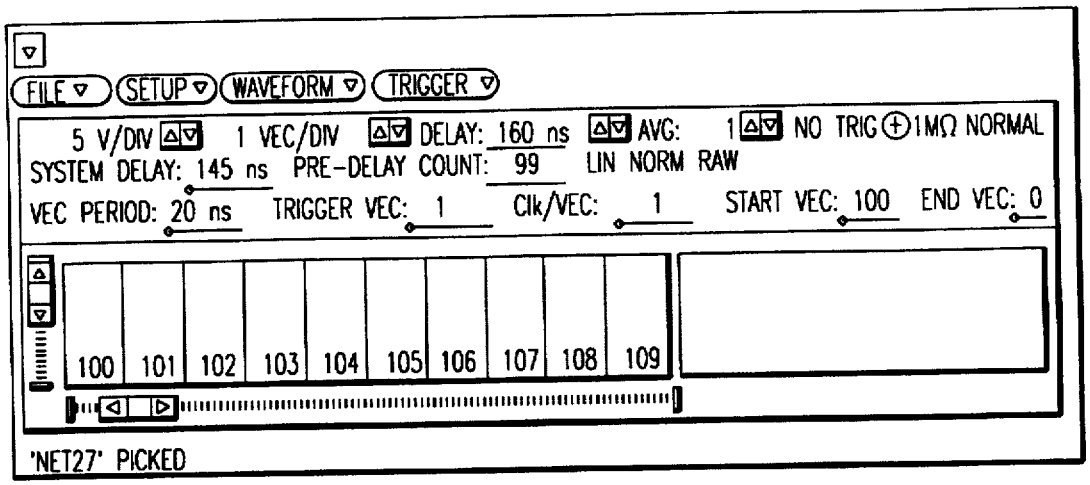
FIG. 18 shows an example of a display in accordance with the invention having one division per vector.
Figure 19:
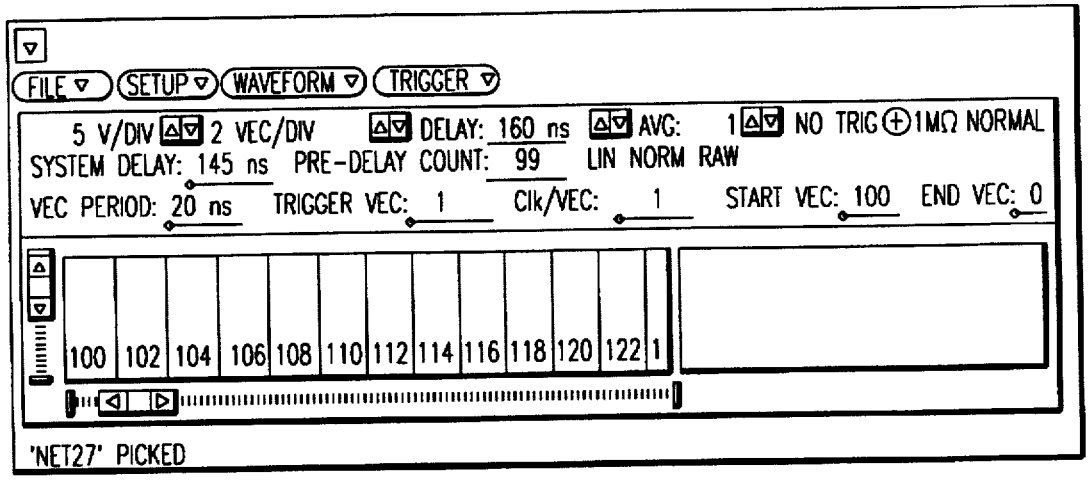
FIG. 19 shows an example of a display in accordance with the invention having two vectors per division.

Other display variations are also possible. For example, the time-scale of the displayed waveform segment in each vector interval can be compressed or expanded in time to fit within the user-defined display interval per vector, e.g., the pixels of waveform data are spaced to correspond to the user-specified vector-display period. FIG. 17 shows an example having two divisions per vector, FIG. 18 shows an example having one division per vector, and FIG. 19 shows an example having two vectors per division. If desired, the user can specify a variable display period so that a particular vector of interest is stretched over a "wide" display interval for close inspection while surrounding vectors are compressed into a "narrow" display interval. If the display is set to low resolution, some of the start-of-vector marks and vector numbers can be suppressed to avoid cluttering the display. For example, the display of FIG. 19 shows only every second start-of-vector mark and every second vector number.

The flexible, vector-based displays can be used to advantage in comparing results of testing from DUT to DUT. For example, waveforms are acquired from a microprocessor operating with a 50 MHz internal clock and to which a vector pattern is applied using Vclock frequency of 50 Mhz. The period of the Vclock pulses is 20 ns. Waveforms are then acquired from the microprocessor operating with a 100 Mhz internal clock and to which the same vector pattern is applied using a Vclock frequency of 100 Mhz. The period of the Vclock pulses in this case is 10 ns. If the microprocessor is operating correctly, the waveform events should be the same, vector-by-vector. To make the comparison, the waveforms are displayed one above the other, with the display scale of the 50 Mhz waveform set to 20 ns/vector and the display scale of the 100 Mhz waveform set to 10 ns/vector. The displayed waveform segments have the same display-scale spacing per vector and the start-of-vector marks are aligned vector by vector.

The methods of the present invention can be used in a variety of ways. The methods are useful for analysis and/or debug of a DUT, and can be readily adapted to any waveform capture instrument, including but not limited to a mechanical probe or non-contact probe using a focused ion beam or electron beam. The user can setup waveform capture and display conditions based on vector number. Other information can be attached to captured waveform information for further signal processing of the waveform, such as concatenation of separately-captured waveforms based on vector number, and superimposing waveform data on top of other waveforms for adding fine waveform information to already existing coarse waveform information vector-by-vector.

Those of skill in the art will recognize that many modifications may be made in the embodiments described without departing from the spirit and scope of the invention as defined in the following claims.

I claim:

1. A vector-based method of waveform acquisition and display, comprising:
 a. repetitively applying a sequential pattern of vectors to a device, each vector having a vector number and a period which is synchronous with a clock signal, and the pattern being synchronous with a periodic trigger pulse,
 b. detecting the clock signal and the trigger pulses,
 c. probing a net of the device to acquire waveform data,
 d. counting vector periods as the waveform data is acquired, and associating with each vector period a segment of waveform data acquired during that period, and
 e. displaying segments of the acquired waveform data along with indications of the vector periods with which the waveform segments are associated.

2. The method of claim 1, further comprising the steps of relating each vector period with a vector number and displaying the vector number with the waveform segment of the associated vector period.

3. The method of claim 1, further comprising the setup steps of:

identifying values of (i) a vector number corresponding to a known state change on a net of the device, (ii) a vector number of a first full vector period after the trigger pulse is detected, (iii) a number of dock signal periods per vector period, (iv) duration of vector periods, and (v) vector numbers of repeated vectors and the number of repetitions of repeated vectors during each repetition of the pattern, and storing the identified values as setup data.

4. The method of claim 1, further comprising the calibration steps of:

identifying the vector number of a vector period during which a known state change is expected on a net of the device, estimating a number of clock signal periods to count following detection of a trigger pulse to find the known state change, displaying waveform data acquired during an interval corresponding approximately to the estimated number of clock signal periods, and adjusting the estimated number of clock signal periods until the displayed waveform data includes the known state change, marking the position of a selected vector number relative to the known state change, determining values of (i) a system delay, (ii) relationship of the count of clock signal periods to vector numbers, (iii) relationship of clock signal periods to the trigger pulse and to vector periods, and (iv) first full vector period during which waveform data can be acquired, and storing the determined values as calibration data.

5. The method of claim 1, further comprising the steps of entering a range of vector numbers representing a set of vector periods during which waveform data is to be acquired and determining that waveform data is available for acquisition acquired during said range.

6. The method of claim 5, comprising the steps, for each vector period of said range, of:

determining a number of clock signal periods to count following detection of the trigger to begin acquisition of waveform data, counting the determined number of clock signal periods, beginning acquisition of waveform data at the beginning of the next full vector period, and relating a segment of waveform data acquired during each vector period with a respective vector number.

7. The method of claim 6, further comprising storing the acquired waveform data segments with respective vector numbers.

8. The method of claim 1, further comprising the step of setting display parameters including number of vectors per display division and starting vector number of the display.

9. The method of claim 1, further comprising the step of setting a display option defining whether vector loops are to be included in the display.

10. The method of claim 1, further comprising the step of setting vector numbers for which waveforms are to be displayed.

11. The method of claim 1, further comprising the step of displaying start-of-vector marks with the displayed waveform data.

12. The method of claim 1, further comprising the step of displaying waveform segments corresponding to repeat vectors.

13. The method of claim 1, further comprising the step of displaying waveform data segments of multiple vector periods per display division.

14. The method of claim 1, wherein probing a net of the device comprises applying a focused particle beam to the net and detecting secondary particles.

* * * * *